United States Patent [19]
Mihailovits et al.

[11] Patent Number: 5,847,605
[45] Date of Patent: Dec. 8, 1998

[54] FOLDED ACTIVE FILTER

[75] Inventors: Nicholas Mihailovits, Sale; Trevor P Beatson, Manchester, both of United Kingdom

[73] Assignee: Plessey Semiconductors Limited, United Kingdom

[21] Appl. No.: 739,419

[22] Filed: Oct. 29, 1996

[30]      Foreign Application Priority Data

Nov. 1, 1995 [GB] United Kingdom .................... 9522365
Nov. 1, 1995 [GB] United Kingdom .................... 9522366

[51] Int. Cl.⁶ ....................................................... H03F 3/45
[52] U.S. Cl. .......................... 330/252; 330/303; 330/305; 330/306; 327/553; 327/558
[58] Field of Search ..................................... 330/252, 302, 330/303, 305, 306; 327/552, 553, 558

[56]               References Cited

U.S. PATENT DOCUMENTS 4,514,704  4/1985  Curtis .
4,914,401  4/1990  Mäder ................................. 330/306 X
5,489,878  2/1996  Gilbert ....................................... 331/57

FOREIGN PATENT DOCUMENTS 0 352 790 A2  7/1989  European Pat. Off. .
0 352 790     1/1990  European Pat. Off. .
59181807      2/1985  Japan .
1 120 592     7/1968  United Kingdom .

*Primary Examiner*—James B. Mullins
*Attorney, Agent, or Firm*—Kirschstein et al.

[57]               ABSTRACT

A filter circuit comprises three stages 260, 270, 280, each having a differential input and a differential output. The output of stage 260 serves as the input of stage 270 and the output of stage 270 serves as the input of stage 280 respectively. Stage 260 comprises two transistor pairs 201, 202 and 203, 204. An input signal is applied to the base electrodes of transistors 201, 204 which causes a current change in their opposite transistor 202, 203. Transistors 202, 203 have their respective base and collector electrodes connected together. The collector electrodes of transistors 202, 203 constitute the output of stage 260. Stages 270 and 280 have essentially the same structure as stage 260. The arrangement offers high frequency capabilities from a low supply voltage. In another embodiment, a cut-off frequency is varied under control of controllable current sources.

8 Claims, 3 Drawing Sheets

FOLDED ACTIVE FILTER

BACKGROUND OF THE INVENTION

The present invention relates to active filter circuits and more particularly to folded active filter circuits.

This application relates to a development of a filter stack circuit described and claimed in a co-pending application claiming GB 9522366.5 as priority.

In that application it is described how an active filter can be implemented as a stack of cross-coupled transistor pairs. An example of such a filter using resistors capacitors and transistors is shown in FIG. 1.

FIG. 1 shows a third order low pass stacked filter circuit. The filter circuit comprises three cascoded stages 140, 150, 160, the differential output of one stage being used as the differential input of the following stage. There are two major current paths, the first major current path being through the collector-emitter paths of transistors 101, 103 and 105. The second major current path is that through the collector-emitter paths of transistors 102, 104 and 106.

The first stage 140 of the filter circuit comprises npn transistors 101, 102, resistors 110, 111 and capacitor 120. The filter circuit input is applied to the base electrodes of transistors 101 and 102 which act as voltage followers. The differential output of this stage is across capacitor 120, this forming the differential input of second stage 150. The collector electrode of each npn transistor 103, 104 of second stage 150 is cross coupled to the base electrode of the npn transistor 104, 103 controlling the other major current path. It can be seen that third stage 160, terminating in capacitor 122, has the same structure as that at second stage 150. Current sources 130, 131 draw a constant current from their respective differential output of third stage 160. The filter circuit low-pass output is taken across capacitor 122.

A filter implemented in a circuit of this type has the advantages of low current usage and simplicity of both design and construction.

However, where a large number of stages are used in the filter, a high supply voltage is needed to allow for the voltage drop across each base-emitter junction. In an eight stage filter using silicon transistors, for example, 5.6 volts are required just to keep the transistors switched on.

SUMMARY OF THE INVENTION

It is an object of the present invention to provide an active filter circuit achieving similar benefits to the above mentioned filters whilst being able to operate from a low voltage supply.

In accordance with the present invention, there is provided an active filter comprising a plurality of differential stages connected in cascade, each stage including four transistors connected as two emitter-coupled pairs, with one transistor of each pair having its base and collector electrodes connected together and to a respective differential output of the respective stage, and with the base electrodes of the other transistors of each pair connected to respective differential inputs of the stage, the differential inputs of at least one of said plurality of stages being cross-coupled with the differential outputs of the immediately preceeding stage.

BRIEF DESCRIPTION OF THE DRAWINGS

An embodiment of the present invention will now be described, by way of example, with reference to the accompanying drawings, of which.

DETAILED DESCRIPTION OF THE PREFERRED EMBODIMENTS

Figure 1:
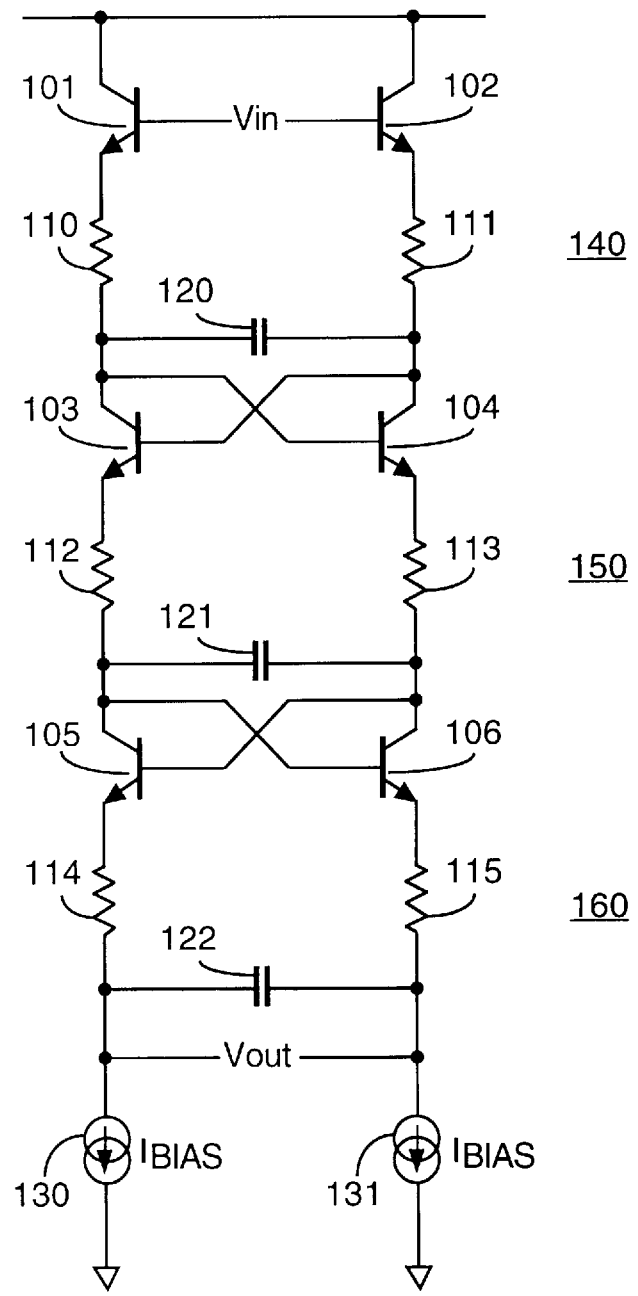
FIG. 1 shows a stacked active filter.

FIG. 1 shows a stacked active filter circuit as described and claimed in co-pending application Ser. No. 08/739,418, filed Oct. 29, 1996. As can be seen, there will be a substantial voltage drop from the voltage supply to ground caused by the base-emitter voltage drops and static d.c. drops across the resistors in both sides of the filter. The active filter circuit of FIG. 2 seeks to retain the advantages of the circuit of FIG. 1 whilst being able to operate from a minimal supply voltage.

Figure 2:
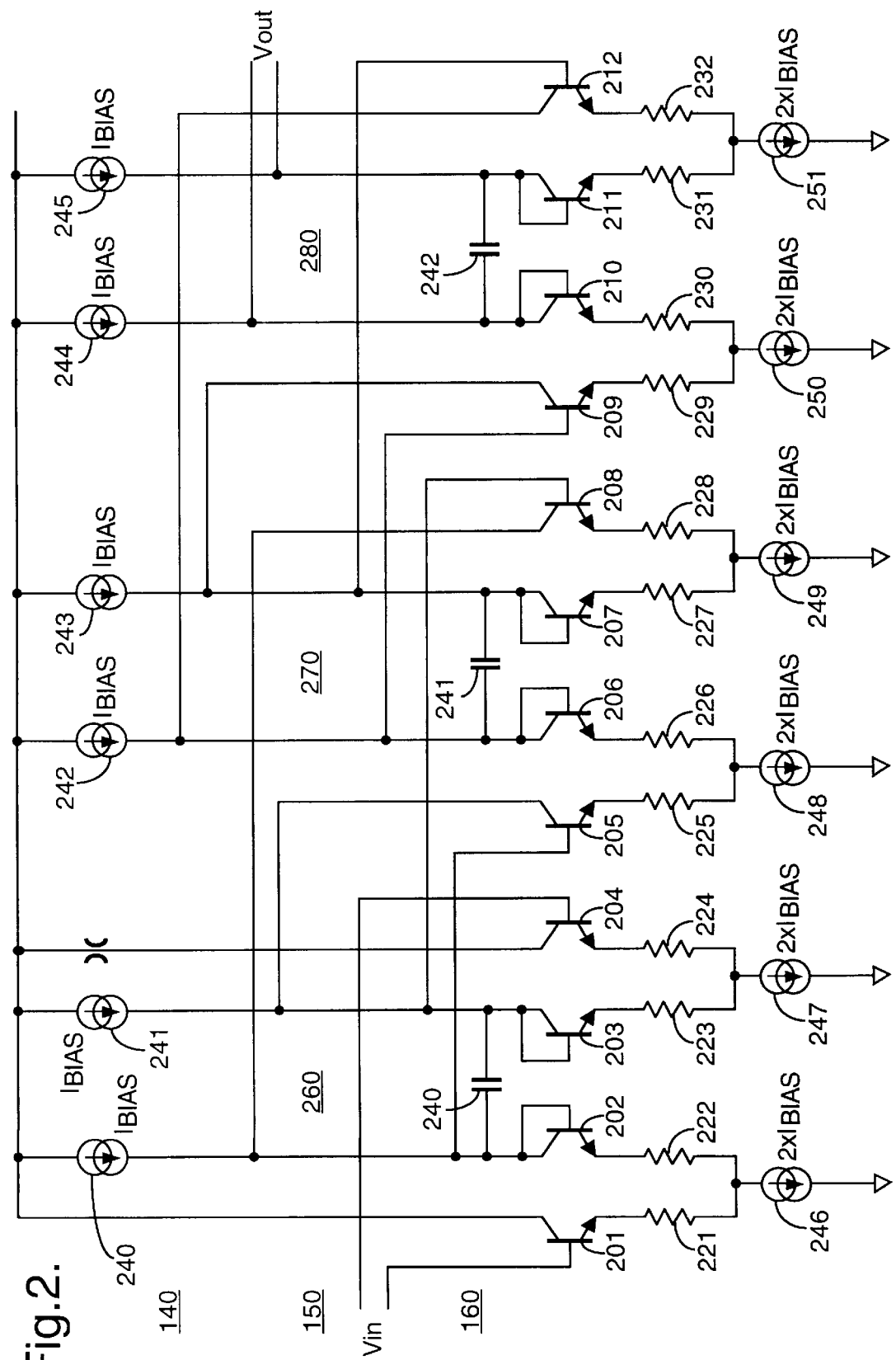
FIG. 2 shows a folded active filter in accordance with the present invention.

FIG. 2 shows a third order low pass folded filter circuit in accordance with the present invention. The circuit is made up of three stages 260, 270, 280, each stage having a first order transfer function. The differential outputs of one stage are fed to the differential inputs of the following stage. The three stage circuit of FIG. 2 therefore comprises a third order filter, in this case a low-pass type.

A differential input signal is applied to the base electrode of transistors 201 and 204 respectively. Each branch of the differential input signal is therefore applied to a different differential transistor pair 201, 202 and 203, 204. It is these two differential transistor pairs 201, 202 and 203, 204 which make up the first stage of the filter circuit. The differential output of this stage is taken from the collectors of transistors 202 and 203. Load capacitor 240 is connected across the output of this first stage. The second stage 270 of the filter circuit has substantially the same circuit layout. The differential inputs to stage 270 come from the differential outputs of stage 260. These inputs are applied to differential transistor pairs 205, 206 and 207, 208. Each stage 260, 270, 280 operates in substantially the same manner with the filter output being taken from the collectors of transistors 210 and 211 of the final stage 280.

It will be appreciated that the input and output level voltages of each stage 260, 270, 280 are compatible. A lower supply voltage is required, as compared to the stacked filter circuit of FIG. 1, because there is only ever the voltage drop across a single transistor junction and a single resistor from supply to ground.

In order to aid the understanding of how a filter stage of the circuit of FIG. 2 having two differential transistor pairs operates, a transformation from the equivalent stacked filter stage will now be described with reference to FIGS. 3, 4 and 4a. It will thus be seen that the equivalent filter circuits perform the same filtering function.

Figure 3:
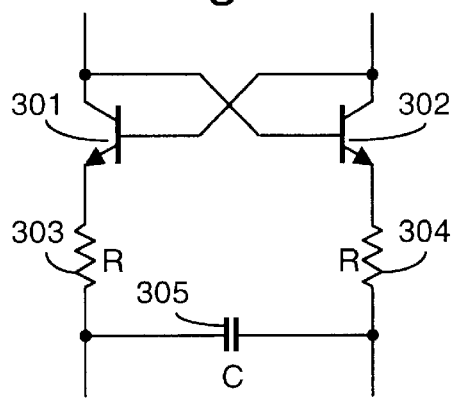
FIG. 3 shows a single stage of the stacked active filter of FIG. 1.

FIG. 3 shows a stage of the cross-coupled emitter follower filter circuit of FIG. 1. Each branch of the filter circuit stage, transistor 301 and resistor 303 or transistor 302 and resistor 304, is effectively an emitter follower having a unity voltage gain. One such emitter follower is shown in FIG. 4.

Figure 4:
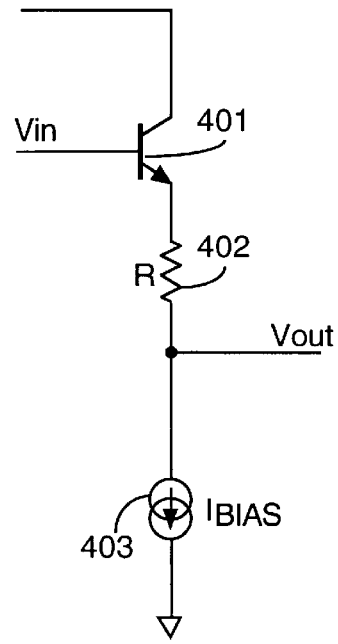
FIGS. 4 and 4a show how an element of the filter stage of FIG. 3 can be made into a differential pair of transistors.

The voltage output by the FIG. 4 circuit follows the input voltage but is stepped down by an amount equal to the sum of the base-emitter voltage of transistor 401 and the voltage drop across resistor 402. To avoid this, a differential pair is used in place of the emitter follower, as shown in FIG. 4a. This arrangement can be thought of as a voltage follower identical to the emitter follower of FIG. 4, except that the output voltage is the same as the input voltage. The current at the collector of transistor 451 remains substantially the same as that in the collector of transistor 401 of the equivalent emitter follower.

Figure 4A:
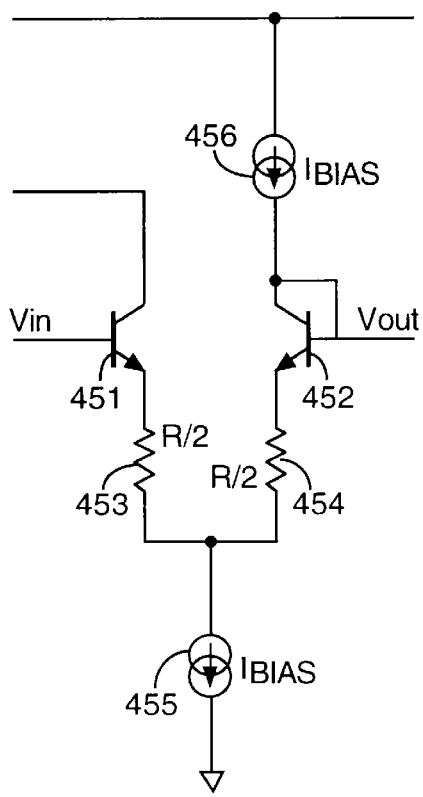

As can clearly be seen, by providing two of the circuits shown in FIG. 4a, one for each of the differential inputs, a circuit equivalent to the single stage filter of FIG. 3 is obtained. By connecting three such stages with the differential outputs of one stage forming the differential inputs of the following stage, the filter circuit of FIG. 2 can be seen to be derived.

In many cases it is necessary to provide a filter having a cut-off frequency that can be controlled electronically. A filter circuit in accordance with the present invention and having such a provision will now be described with reference to FIGS. 4a and 5.

For a bipolar transistor it can be shown that, for small signals, the dynamic impedance of the device is inversely proportional to the static bias current at which the device is operated. Because the impedance of the device is important to the a.c. characteristics of the filter stage in which it is incorporated, the cut-off frequency of a filter incorporating that stage can be controlled by varying the bias current. Cut-off frequency can be controlled in a rough and ready manner by removing the fixed impedances, providing controllable current sources and operating the circuit entirely by the dynamic impedances of the transistors. However, when tunable filters are made in this manner, there is found to be a limit on the maximum signal swing that can be supported. This is because the current through the transistor changes with signal swing, thereby also changing the dynamic impedance of the transistor with signal swing. This non linear behaviour results in harmonic distortion.

Figure 5:
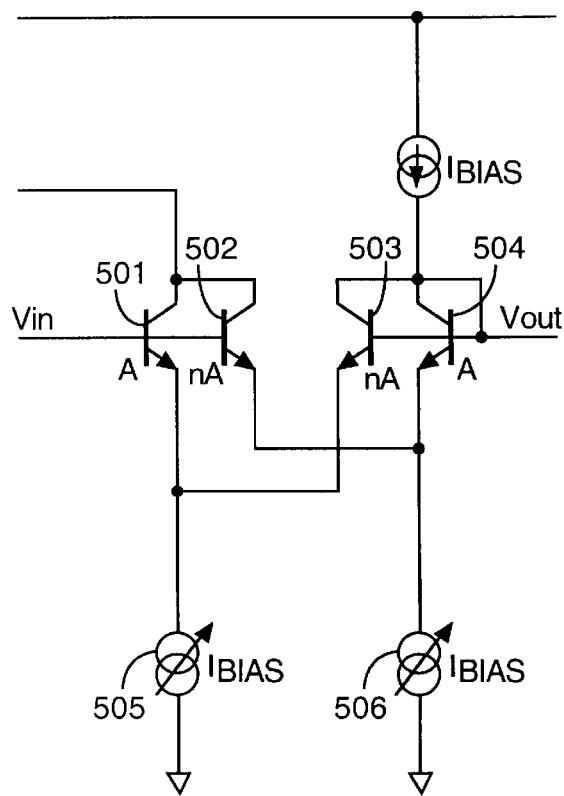
FIG. 5 shows a multi tanh doublet, used in an embodiment of the present invention.

As a preferred enhancement of the present invention, increased linearity is obtained in an electronically tunable active filter by using a multi tanh doublet circuit such as that of FIG. 5.

The FIG. 5 doublet circuit comprises two offset differential pairs, the transistors 501, 502 of a first pair having different emitter areas but the same emitter area as the corresponding transistor 504, 503, in the opposite pair. The ratio of the emitter areas determines the offset voltage at which the devices should be operated, typically being between 4 and 5. This allows a linear response to input signals having a voltage swing of around 40 mv. Substituting this circuit for each differential pair of the circuit shown in FIG. 2 will result in a tunable low-pass filter circuit having a cut-off frequency varied under control of variable current sources. If desired, different filter stages can be controlled by independently variable current sources. The filter provided by this circuit will also show a high degree of linearity.

As will be appreciated, the capacitors need not be connected differentially but could be connected to ground at one end on each side of the stack. This is particularly useful for monolithic implementations where fully floating capacitors are not supported.

By involving only emitter followers in the circuit design and avoiding the use of such devices as operational amplifiers and transconductance amplifiers, much higher operating frequencies are possible.

Because only a.c. feedback mechanisms operate within the circuit, the filter is much less sensitive to d.c. offsets that prior art filters.

The use of transistors as voltage followers, rather than using transconductance amplifiers and the like, ensures that the dc. gain of the filter as seen at the low pass output is unity.

The fact that the common voltage at each node is defined, in contrast to existing transconductor/capacitor filter implementations, eliminates the need for additional common mode stabilisation circuitry.

Because there is a correspondence between the conventional LCR filters and that of the present invention, component values required for the filter implementations are easily calculable.

It will be appreciated that a folded active filter as described above could be implemented using field effect transistors in place of the bipolar transistors, with their control, source and drain electrodes connected in the same way as base, emitter and collector electrodes of the bipolar transistors described above.

We claim:

1. An active filter comprising a plurality of differential stages connected in cascade, each stage including four transistors connected as two emitter-coupled pairs, with one transistor of each pair having its base and collector electrodes connected together and to a respective differential output of the respective stage, and with the base electrodes of the other transistors of each pair connected to respective differential inputs of the stage, the differential inputs of at least one of said plurality of stages being cross-coupled with the differential outputs of the immediately preceding stage.

2. An active filter in accordance with claim 1 in which the differential outputs of at least one stage are linked by a capacitor.

3. An active filter in accordance with claim 1 in which the differential outputs of at least one stage are each linked to ground potential by a capacitor.

4. An active filter in accordance with claim 1 in which each of the differential outputs of at least one stage is connected to a voltage supply by a current source.

5. An active filter in accordance with claim 1 in which the transistors of each transistor pair in at least one stage have their emitters connected to a current source common to said transistor pair by a respective resistive element, the current source connecting the transistors to ground potential.

6. An active filter in accordance with claim 1 which each stage comprises two multi tanh doublets.

7. An active filter in accordance with claim 1 in which an electronically controllable current source is used, control of the current source effecting change of a characteristic of the filter.

8. An active filter in accordance with claim 7 in which the characteristic is a cut off frequency of the filter.

* * * * *